(12) United States Patent
Mason

(10) Patent No.: US 6,859,112 B2
(45) Date of Patent: Feb. 22, 2005

(54) CMOS VOLTAGE CONTROLLED OSCILLATOR CIRCUIT FOR OPERATION WITH LOW SUPPLY VOLTAGE AND METHOD FOR SAME

(75) Inventor: James Stephen Mason, Eastleigh (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/441,345

(22) Filed: May 19, 2003

(65) Prior Publication Data
US 2003/0231072 A1 Dec. 18, 2003

(30) Foreign Application Priority Data
May 30, 2002 (GB) ............................................. 0212436

(51) Int. Cl.[7] ................................................ H03B 5/12
(52) U.S. Cl. ....................... 331/117 FE; 31/74; 31/175; 31/177 V; 31/186
(58) Field of Search ................................ 331/36 C, 74, 331/75, 117 R, 117 FE, 117 D, 175, 177 R, 177 V, 185, 186

(56) References Cited
U.S. PATENT DOCUMENTS 4,593,256 A * 6/1986 Bickley .................. 331/117 R
6,087,896 A 7/2000 Bazzani ....................... 327/581
6,225,871 B1 5/2001 Chien .......................... 331/117
6,281,758 B1 8/2001 Elsayed et al. ............... 331/16

* cited by examiner

Primary Examiner—David Mis
(74) Attorney, Agent, or Firm—Randall J. Bluestone; Harrington & Smith, LLP

(57) ABSTRACT

A voltage controlled oscillator circuit and method comprising: a harmonic oscillator having a cross-coupled NFET devices (T1, T2) and an LC tank circuit (L1, L2, C) performing oscillation; a series voltage regulator (210) regulating voltage applied to the harmonic oscillator via a PFET device (T3) and differential amplifier (R); and a tuning circuit (220) having voltage controlled capacitance 'Zero-Vt' NFET devices (T4, T5) controlling oscillation of the harmonic oscillator. A differential output buffer (B) provides output buffering to a subsequent stage. This provides advantages that: operation at low supply voltages is facilitated and the sensitive oscillator cell is decoupled from the main supply noise offering improved phase noise performance; the output swing of the oscillator has a well controlled common-mode value which can be selected to most efficiently drive a following stage; and using 'Zero-Vt' NFETs facilitates the use of a lower supply voltage.

30 Claims, 4 Drawing Sheets

CMOS VOLTAGE CONTROLLED OSCILLATOR CIRCUIT FOR OPERATION WITH LOW SUPPLY VOLTAGE AND METHOD FOR SAME

FIELD OF THE INVENTION

This invention relates to voltage controlled oscillators, and particularly to such oscillators which can be directly integrated into a CMOS (Complementary Metal Oxide Semiconductor) integrated circuit (IC) and which will oscillate at high frequency.

BACKGROUND OF THE INVENTION

In the field of this invention that high frequency voltage controlled oscillators are commonly used in RF (Radio Frequency) circuit design. The standard 'harmonic oscillator' used in this invention is well known in the literature. However this invention addresses the problems of operating the circuit at low voltage (required for modern CMOS chips) and provides a technique for biasing the output so that it can be conveniently used by following circuitry.

From U.S. Pat. No. 6,225,871 there is known a voltage controlled CMOS oscillator in which the frequency of oscillation of two cross-coupled CMOS inverters with a parallel LC tank circuit connected between the two drains can be varied by a control voltage which varies the capacitance of the tank circuit. However, since the supply to the oscillator is used to tune the oscillator, the connection of a following stage to the oscillator is compromised, the tuning of the oscillator is subject to noise in the supply, and the oscillator supply is not easily decoupled from the chip supply.

From U.S. Pat. No. 6,281,758 there is known a differential LC-based voltage-controlled CMOS oscillator with a charge pump and loop filter architecture. However, this oscillator is susceptible to noise in the power supply. Also, the connection of a following stage to the oscillator compromises the working point of the oscillator.

From U.S. Pat. No. 6,087,896 there is known a capacitive compensation technique using MOS capacitance.

Further, known voltage controlled CMOS oscillators suffer one or more of the following disadvantages:
  difficulty of implementation at low supply voltage (e.g., 1.8V)
  difficulty of coupling oscillator output into a following stage (as, for example, mentioned above)
  difficulty of achieving a required tuning range with a reduced supply voltage.

A need therefore exists for a voltage controlled oscillator circuit wherein the abovementioned disadvantage(s) may be alleviated.

STATEMENT OF INVENTION

In accordance with a first aspect of the present invention there is provided a voltage controlled oscillator circuit comprising: oscillator means for performing oscillation; voltage regulator means for regulating voltage applied to the oscillator means; and, tuning means for controlling oscillation of the oscillator means.

In accordance with a second aspect of the present invention there is provided a method of operating a voltage controlled oscillator circuit comprising: providing oscillator means performing oscillation; providing voltage regulator means regulating voltage applied to the oscillator means; and providing tuning means controlling oscillation of the oscillator means.

BRIEF DESCRIPTION OF THE DRAWINGS

One voltage controlled oscillator circuit and method for a low voltage CMOS tuned oscillator incorporating the present invention will now be described, by way of example only, with reference to the accompanying drawings, in which.

DESCRIPTION OF PREFERRED EMBODIMENT

Figure 1:
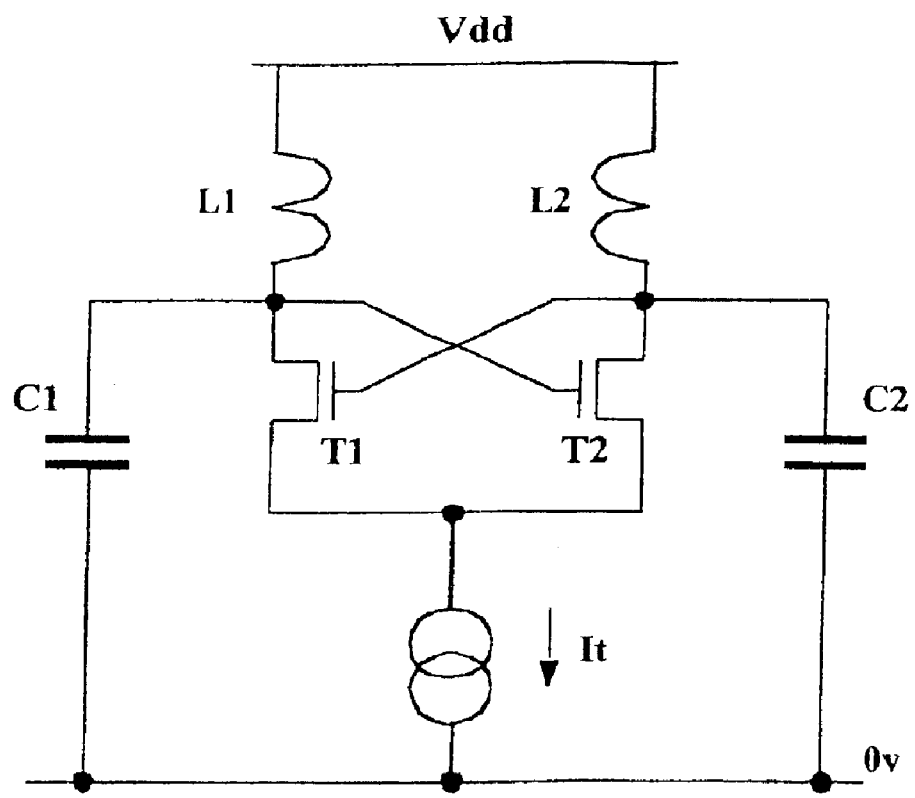
FIG. 1 shows a schematic circuit diagram of a prior art, standard, harmonic oscillator.

Referring firstly to FIG. 1, a conventional harmonic oscillator circuit as shown comprises a cross-coupled NFET (N-channel Field Effect Transistor) pair T1 and T2, biased with a tail current source It, which provides a negative resistance element which counteracts the losses within an LC tank circuit formed by L1, C1 and L2, C2 (principally the self resistance of the inductors L1 and L2). When the conditions have been achieved for oscillation, the circuit will oscillate at a frequency given by the resonant frequency of the inductor and capacitor combination. This circuit is well known and is generally used to implement harmonic oscillator designs. It is also possible to replace the capacitors C1 and C2 with a single capacitor connected between the drains of the transistor pair T1 and T2. During oscillation, the voltage at the nodes which connect the inductor to the NFET drain will oscillate around the supply voltage Vdd. The amplitude of oscillation is set by the level to which this node is pulled down below Vdd by the relevant NFET when this device switches on during its conduction cycle. The voltage waveform at the L1/C1/T1 drain connection will be in antiphase to that at the L2/C2/T2 drain connection.

As mentioned above, such a standard circuit is subject to problems of operating the circuit at low voltage (required for modem CMOS ICs) and achieving a required tuning range with a reduced supply voltage, and coupling oscillator output into a following stage without compromising oscillator operation.

Figure 2:
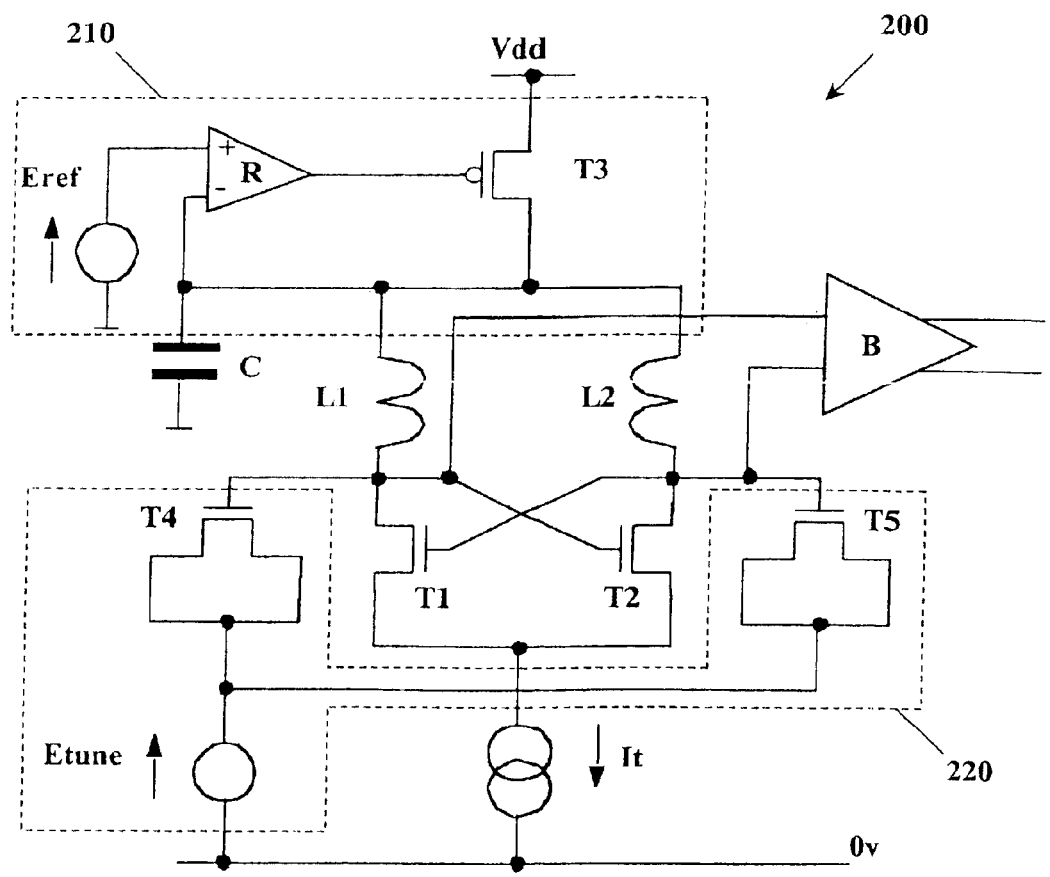
FIG. 2 shows a schematic circuit diagram of a low voltage CMOS tuned oscillator incorporating the present invention.

Referring now to FIG. 2, an improved voltage controlled oscillator circuit 200 is based upon the standard prior art oscillator circuit of FIG. 1, with enhancements. The improved voltage controlled oscillator circuit 200 includes a cross-coupled pair of NFET transistors T1 and T2 coupled to a current source It and an LC tank circuit comprised of inductors L1 and L2 and a capacitor C.

The common junction of the capacitor C and the sources of the inductors L1 and L2 is coupled to a supply voltage (Vdd) rail via a series voltage regulator circuit 210 including a PFET (P-channel FET) transistor T3. The FET T3 has its gate electrode coupled to the output of a differential amplifier R, whose inverting and non-inverting inputs are connected respectively to the common L1/L2/C junction and a reference voltage source Eref. The common junction of the inductor L1 and the drain of the FET T1 and the common junction of the inductor L2 and the drain of the FET T2 are connected to respective inputs of a differential buffer amplifier B, whose balanced output forms the output of the oscillator circuit.

The common junction of the inductor L1 and the drain of the FET T1 are connected to the gate of an FET transistor T4, whose drain and source are connected to a tuning voltage source Etune of tuning circuitry 220. Similarly, the common junction of the inductor L2 and the drain of the FET T2 are connected to the gate of an FET transistor T5, whose drain and source are connected to the tuning voltage source Etune.

The oscillator circuit 200 allows a high frequency (5 GHz) tuned oscillator to be implemented in a low voltage (1.8V) CMOS technology. It addresses the problem of biasing such a circuit so that it can operate within the supply voltage range and provide a well defined operating point for subsequent buffering (or other) circuitry which receives the oscillator output. An advantage of this configuration is that it allows the power supply of the oscillator to be lower than the supply rail voltage for the chip which enables decoupling of the two supplies, in this case through the series regulator circuit 210 formed by the FET T3, the differential amplifier R and the reference voltage source Eref. This allows the isolation of noise between the two supplies, which is an important consideration in oscillator design, to ensure the best noise performance for the oscillator.

By biasing the common connection of the inductors L1 and L2 below Vdd, conveniently achieved by the series regulator using the PFET T3 as a series pass element included in a voltage follower circuit, the voltage at the common connection for the inductors L1 and L2 is maintained at the reference voltage Eref. Consequently the outputs of the oscillator (at the gates of the FETs T4 and T5) move about Eref instead of Vdd and are used to conveniently drive the differential buffer B which is itself powered from Vdd. In this way, other problems associated with circuit nodes moving above Vdd can be avoided such as the conduction of parasitic P—N junctions contained within the circuit device structures. As mentioned above, another important advantage of this arrangement is that the PFET T3 can effectively decouple the oscillator from noise on the Vdd supply which can introduce noise onto the oscillator output thereby degrading its performance.

A further improvement in the circuit 200 arises in the way that the oscillation frequency is set by the tuning circuitry 220. It will be appreciated that the gate capacitance of an FET will change with its bias condition: when a channel is formed the gate capacitance to ground will be higher than when the channel is not formed. In the tuning circuitry 220, the FETs T4 and T5 are used in this way as tuning devices, and the voltage source Etune is used to set whether a channel is formed on these devices. However, as a consequence of reducing the oscillator supply voltage to the reference voltage Eref as described above, there is consequently less voltage at the capacitor connection with which to turn on these FET devices. In the oscillator circuit 200, the solution for this problem is to use low-Vt NFET devices (so-called 'Zero-Vt' NFETs) instead of standard NFET devices for the FETs T4 and T5. A 'Zero-Vt' NFET is available in many CMOS processing technologies and has a different channel implant diffusion such that a much lower gate voltage is required to turn on the device (and hence form the channel) as compared to a standard NFET. In the oscillator circuit 200, the channel in the 'Zero-Vt' NFETs T4 and T5 is turned off by taking Etune above the gate voltage and this can be conveniently achieved in this circuit technology, where there is a known differential between Eref and Vdd, by connecting Etune to Vdd for this state.

Figure 3:
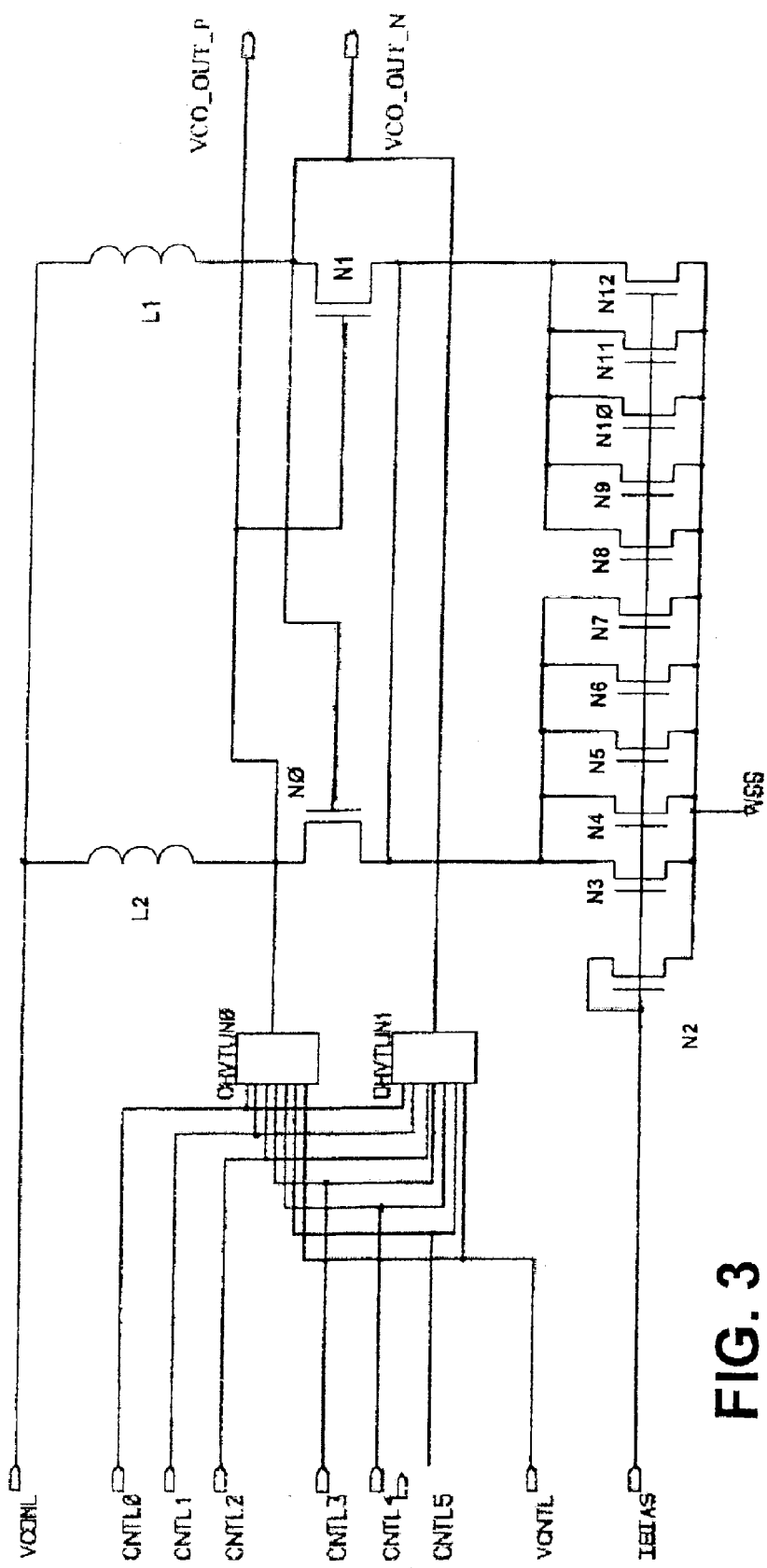
FIG. 3 shows a detailed schematic circuit diagram of an implementation of a harmonic oscillator cell of the oscillator of FIG. 2.

Referring now to FIG. 3, in a detailed practical implementation of the oscillator circuit 200 the harmonic oscillator cell of the oscillator is formed by inductors L1 and L2 and cross-coupled NFET devices N0 and N1 (analogous to components T1 and T2 in the circuit 200) which provide the negative impedance element for the oscillator. The magnitude of this negative impedance is controlled through the tail current source formed by current mirror FETs N2-N12 which are connected to supply voltage rail VSS. Adjusting the input current through input IBIAS allows the operating current of N0 and N1 to be controlled and therefore allows the drive level of the oscillator to be controlled. Operation of the FETs N0 and N1 is controlled from inputs CNTL0-5 and VCNTL via decoders OVHTUN0 and OVHTUN1. Input VCOML provides the supply voltage from the series regulator circuit (not shown), the design of which is well known, as is the design of suitable differential buffer circuitry to buffer the oscillator output VCO_OUT_P and VCO_OUT_N, and need not be described in further detail.

Figure 4:
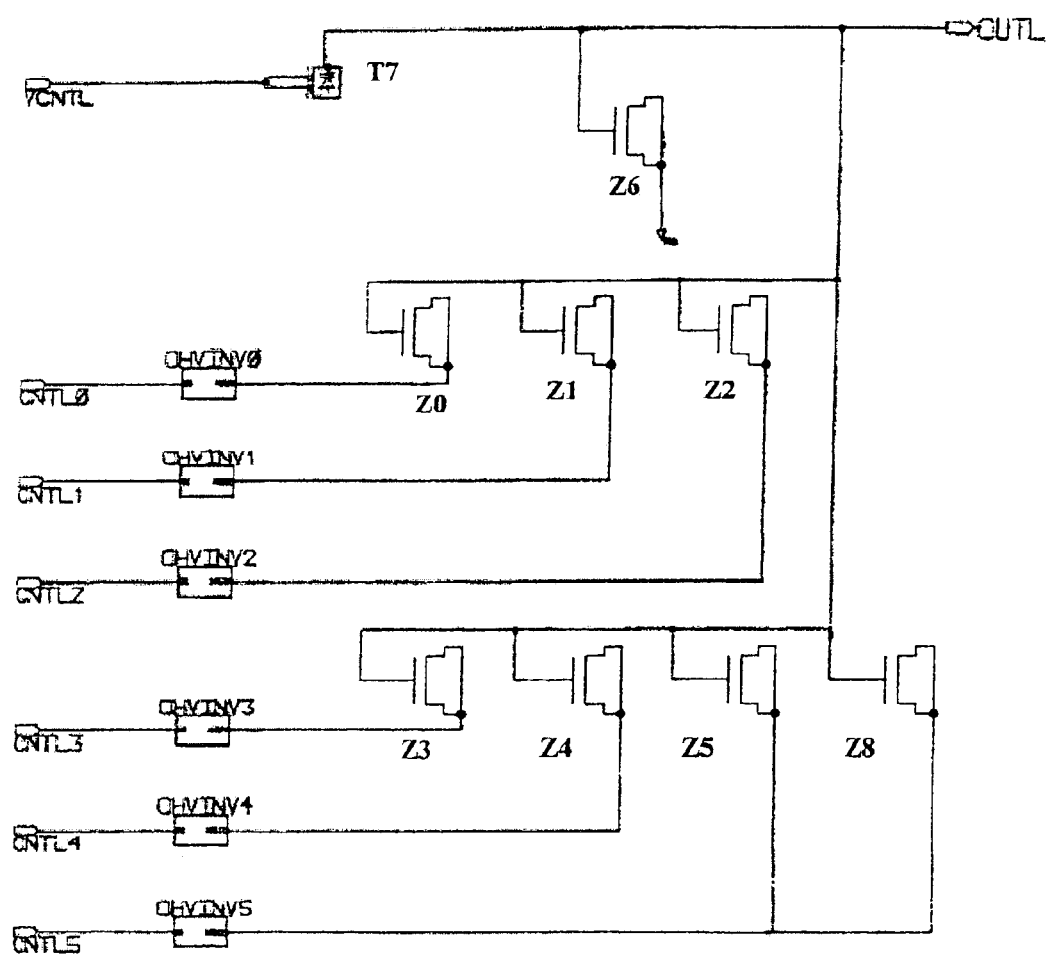
FIG. 4 shows a detailed schematic circuit diagram of an implementation of tuning circuitry of the oscillator of FIG. 2.

Referring now to FIG. 4, in a detailed practical implementation of the 'Zero VT' NFET T4 or T5 in the tuning circuitry 220 for the harmonic oscillator circuit 200, 'Zero VT' NFETs Z0-Z6 and Z8 set the nominal frequency of the oscillator. A 6-bit address, at inputs CNTL0-5, provides coarse tuning of frequency, with a varactor T7 allowing fine adjustment through input VCNTL. Inverters OHVINV0-5 provide buffering for the tuning FETs and also establish the high frequency ground connection path for these devices.

It will be appreciated that the voltage tuned oscillator circuit 200 of FIG. 2, with the circuitry of FIG. 3 and FIG. 4, will typically be fabricated in a CMOS integrated circuit (not shown) intended for low voltage operation.

In summary it will be understood that the improved voltage tuned oscillator circuit described above offers the following advantages over the previous designs in that:

It better facilitates operation at low supply voltages and powers the oscillator cell through a series pass voltage regulator. The capacitor C acts to locally decouple the supply to the oscillator and the series impedance of the pass transistor, T3, together with this on-chip capacitor, C, will act as a low pass filter thereby attenuating the high frequency noise on the chip supply before it reaches the oscillator. This allows the sensitive oscillator cell to be decoupled from the main supply noise offering improved phase noise performance over conventional designs.

The output swing of the oscillator has a well controlled common-mode value which can be selected to most efficiently drive a following stage.

Using low- or 'Zero-Vt' NFETs to form the capacitor tuning elements facilitates the use of a lower supply voltage for the oscillator.

It will be understood that various modifications to the improved voltage tuned oscillator circuit described will be apparent to a person of ordinary skill in the art.

What is claimed is:

1. A voltage controlled oscillator circuit comprising:
an oscillator circuit for performing oscillation;
a voltage regulator circuit for regulating voltage applied to the oscillator circuit; and,
a tuning circuit for controlling oscillation of the oscillator circuit, wherein the tuning circuit comprises a voltage controlled capacitor coupled to a tuning voltage source; wherein the tuning voltage source is adapted for controlling the capacitance of the capacitor and the oscillation frequency of the oscillator circuit: and wherein the voltage controlled capacitor comprises a low-Vt FET device.

2. The circuit of claim 1 wherein the oscillator circuit comprises a harmonic oscillator comprising cross-coupled transistors and an LC tank circuit.

3. The circuit of claim 2 wherein the cross-coupled transistors comprise FET devices.

4. The circuit of claim 1 wherein the voltage regulator circuit comprises a series voltage regulator comprising:
 a series regulator transistor coupled between a supply voltage and the oscillator circuit; and,
 a differential amplifier comprising:
 a first input coupled to a reference voltage,
 a second input coupled to the output of the voltage regulator circuit, and
 an output coupled to a control input of the series regulator transistor.

5. The circuit of claim 4 wherein the series regulator transistor comprises an FET device.

6. The circuit of claim 5 wherein the cross-coupled transistors comprise FET devices.

7. The circuit of claim 1 wherein wherein the low-Vt FET devices comprise Zero-Vt FET devices.

8. The circuit of claim 1 further comprising a buffer circuit coupled to an output of the oscillator circuit.

9. The circuit of claim 8 wherein the buffer circuit comprises a differential amplifier coupled to outputs of the oscillator circuit.

10. The circuit of claim 1 wherein the oscillator circuit is arranged to operate at a supply voltage adapted for operation of a CMOS device.

11. The circuit of claim 10 wherein the oscillator circuit is arranged to operate at a voltage of substantially 1.8 V.

12. The circuit of claim 1 wherein the oscillator circuit is arranged to operate at an oscillation frequency of substantially 5 GHz.

13. An integrated circuit comprising the oscillator circuit of claim 1.

14. A method of operating a voltage controlled oscillator circuit comprising:
 providing an oscillator circuit adapted for performing oscillation;
 regulating a voltage applied to the oscillator circuit with a voltage regulator circuit; and
 tuning oscillation of the oscillator circuit with a voltage controlled tuning circuit, wherein the voltage controlled tuning circuit comprises a capacitor and wherein the capacitor comprises a low-Vt FET device, and wherein tuning comprises controlling a voltage received by the capacitor, thereby controlling the oscillation frequency of the oscillator circuit.

15. The method of claim 14 wherein the oscillator circuit comprises a harmonic oscillator comprising cross-coupled transistors and an LC tank circuit.

16. The method of claim 15 wherein the cross-coupled transistors comprise FET devices.

17. The method of claim 14 wherein regulating the voltage comprises:
 directing the supply voltage to a series regulator transistor coupled between the supply voltage and the oscillator circuit;
 applying a reference voltage to a first input of a differential amplifier, the differential amplifier having
 a second input coupled to the output of the voltage regulator circuit, and
 an output coupled to a control input of the series regulator transistor;
 wherein operating the series regulator transistor as a series pass element in a voltage follower circuit permits biasing a common connection with the oscillator circuit below the supply voltage, thereby regulating the voltage at the common connection substantially at the reference voltage.

18. The method of claim 17 wherein the series regulator transistor comprises an FET device.

19. The method of claim 15 wherein the cross-coupled transistors comprise CMOS FET devices.

20. The method of claim 14 wherein the low-Vt FET devices comprise Zero-Vt FET devices.

21. The method of claim 14 further comprising providing a buffer circuit coupled to the oscillator circuit output.

22. The method of claim 21 wherein the buffer circuit comprises a differential amplifier coupled to outputs of the oscillator circuit.

23. The method of claim 14 wherein the oscillator circuit operates at a supply voltage adapted for operation of a CMOS circuit.

24. The method of claim 14 wherein the oscillator circuit operates at a voltage of substantially 1.8 V.

25. The method of claim 14 wherein the oscillator circuit operates at an oscillation frequency of substantially 5 GHz.

26. A voltage controlled oscillator circuit comprising:
 oscillator means for performing oscillation;
 voltage regulator means for regulating a voltage applied to the oscillator means to be less than a voltage appearing at a voltage rail; and
 voltage controlled tuning means for controlling oscillation of the oscillator means wherein the voltage controlled tuning means comprises a voltage controlled capacitor circuit coupled to a tuning voltage source:
 wherein the tuning voltage source is adanted for controlling the capacitance of the capacitor and the oscillation frequency of the oscillator means; and wherein the voltage controlled capacitor comprises a low-Vt FET device.

27. An integrated circuit comprising a voltage controlled oscillator circuit, said voltage controlled oscillator circuit comprising a resonant circuit comprised of a first inductance having a first node coupled through a first FET to a current source, a second inductance having a first node coupled through a second FET to said current source, and a capacitance coupled to a second node of said first inductance and to a second node of said second inductance, said first FET comprising a gate coupled to said first node of said second inductance, said second FET comprising a gate coupled to said first node of said first inductance, said gates of said first and second FETs being further coupled to voltage controlled oscillator turning means, where said second node of each of said first and second inductances is further coupled to a regulated voltage supply having a magnitude less than a magnitude of a voltage rail.

28. An integrated circuit as in claim 27, where the first node of the first inductance and the second node of the second inductance are further coupled to inputs of a buffer circuit that comprises an oscillator circuit output.

29. An integrated circuit as in claim 27, where said magnitude of said voltage rail is about 1.8 volts.

30. An integrated circuit as in claim 28, wherein said oscillator output circuit outputs an oscillator signal having a frequency of about 5 GHz.

* * * * *

UNITED STATES PATENT AND TRADEMARK OFFICE
CERTIFICATE OF CORRECTION

PATENT NO.     : 6,859,112 B2
DATED          : February 22, 2005
INVENTOR(S)    : James S. Mason It is certified that error appears in the above-identified patent and that said Letters Patent is hereby corrected as shown below:

Column 5,
Line 20, delete "wherein".

Column 6,
Line 34, delete "adanted" and replace with -- adapted --.

Signed and Sealed this

Seventeenth Day of May, 2005

JON W. DUDAS
*Director of the United States Patent and Trademark Office*